(12) United States Patent
Hong et al.

(10) Patent No.: US 11,320,924 B2
(45) Date of Patent: May 3, 2022

(54) DEFORMABLE DISPLAY DEVICE THAT DETERMINES WHEN IT IS FOLDED

(71) Applicant: SAMSUNG DISPLAY CO., LTD., Yongin-si (KR)

(72) Inventors: Won Ki Hong, Yongin-si (KR); So Hee Park, Yongin-si (KR); Moon Hee Seo, Yongin-si (KR); Hyeon Jun Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/908,711

(22) Filed: Jun. 22, 2020

(65) Prior Publication Data
US 2021/0124452 A1   Apr. 29, 2021

(30) Foreign Application Priority Data

Oct. 25, 2019   (KR) .......................... 10-2019-0133982

(51) Int. Cl.
*G06F 3/041*   (2006.01)

(52) U.S. Cl.
CPC .......... *G06F 3/0414* (2013.01); *G06F 3/0418* (2013.01); *G06F 2203/04102* (2013.01)

(58) Field of Classification Search
CPC .............. G06F 3/0414; G06F 3/04144; G06F 3/04146; G06F 3/0418; G06F 2203/04102; G06F 1/1652; G06F 3/0416; G06F 2203/04105; H01L 27/3244; H01L 2251/5338; G09F 9/301; G01L 5/00; G09G 3/035; G09G 3/3225; G09G 3/2085; H04M 1/0214
See application file for complete search history.

(56) References Cited

U.S. PATENT DOCUMENTS

| | | | |
|---|---|---|---|
| 7,511,702 B2 | 3/2009 | Hotelling et al. |
| 7,538,760 B2 | 5/2009 | Hotelling et al. |
| 8,274,960 B2 | 9/2012 | Bernstein et al. |
| 8,654,524 B2 | 2/2014 | Pance et al. |
| 8,686,952 B2 | 4/2014 | Burrough et al. |
| 8,787,006 B2 | 7/2014 | Golko et al. |
| 9,170,678 B2 | 10/2015 | Cho et al. |
| 9,178,599 B2 | 11/2015 | Berstein |
| 9,513,663 B2 | 12/2016 | Jones et al. |
| 9,661,719 B2 | 5/2017 | Jang et al. |
| 9,886,116 B2 | 2/2018 | Parivar et al. |

(Continued)

FOREIGN PATENT DOCUMENTS

| KR | 10-2014-0022180 | 2/2014 |
|---|---|---|
| KR | 10-2014-0115226 | 9/2014 |

(Continued)

*Primary Examiner* — Temesghen Ghebretinsae
*Assistant Examiner* — Ivelisse Martinez Quiles
(74) *Attorney, Agent, or Firm* — F. Chau & Associates, LLC

(57) ABSTRACT

A display device controls a display by changing a reference value set in a foldable area of a display panel. The display device includes a display panel displays an image and outputs force sensing signals, and a controller that converts the force sensing signals into force values and controls the display when the force values in the foldable area of the display area are equal to or greater than a second reference value different from a first reference value.

20 Claims, 14 Drawing Sheets

(56) References Cited

U.S. PATENT DOCUMENTS

| | | |
|---|---|---|
| 10,444,917 B2 | 10/2019 | Seo et al. |
| 2013/0222207 A1* | 8/2013 | Baek .................. G06F 5/00 |
| | | 345/1.1 |
| 2014/0085213 A1 | 3/2014 | Huppi et al. |
| 2014/0101560 A1* | 4/2014 | Kwak ............... G06F 3/04883 |
| | | 715/738 |
| 2015/0220118 A1* | 8/2015 | Kwak .................. G09F 9/00 |
| | | 345/667 |
| 2016/0239133 A1 | 8/2016 | Ko et al. |
| 2018/0242446 A1 | 8/2018 | Cho et al. |

FOREIGN PATENT DOCUMENTS

| | | |
|---|---|---|
| KR | 10-2016-0101315 | 8/2016 |
| KR | 10-2018-0026024 | 3/2018 |
| KR | 10-2018-0097356 | 8/2018 |

\* cited by examiner

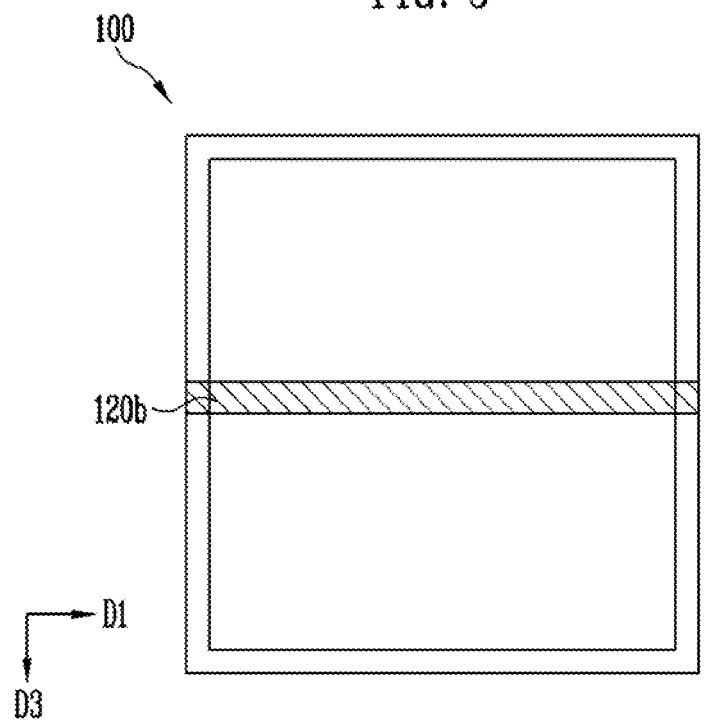
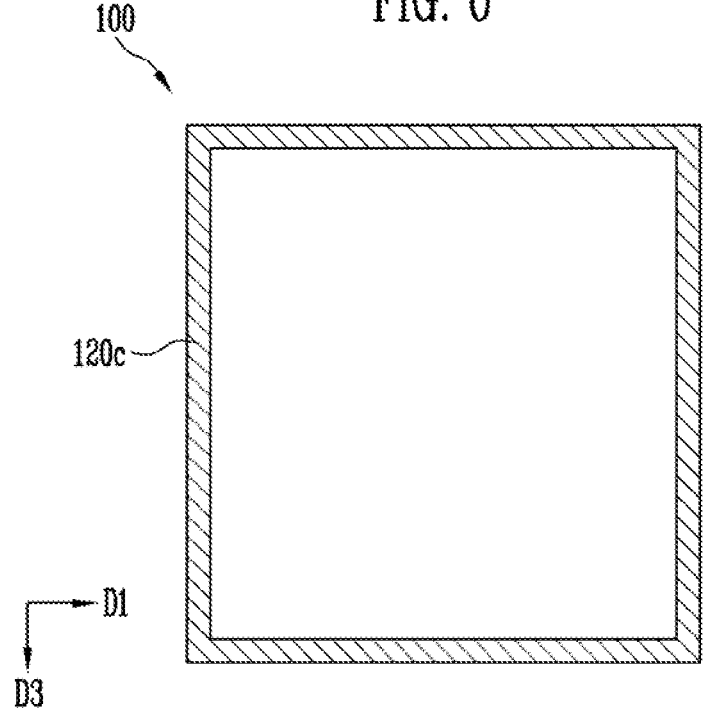

DEFORMABLE DISPLAY DEVICE THAT DETERMINES WHEN IT IS FOLDED

This application claims priority from Korean Patent Application No. 10-2019-0133982, filed on Oct. 25, 2019 in the Korean Intellectual Property Office, and all the benefits accruing therefrom under 35 U.S.C. § 119, the content of which are herein incorporated by reference in their entirety.

BACKGROUND

1. Technical Field

Embodiments of the disclosure are directed to a display device.

2. Discussion of the Related Art

An electroluminescent display device may be classified as an inorganic light emitting display device or an organic light emitting display device according to a material of a light emitting layer. An active matrix type organic light emitting display device includes an organic light emitting diode, hereinafter referred to as an "OLED", that emits light by itself, and has a fast response speed is fast, efficient light emission, high luminance, and a large viewing angle.

A driving circuit of a flat panel display device includes a data driving circuit that supplies a data signal to data lines, a scan driving circuit that supplies a gate signal or scan signal) to gate lines or scan lines, etc. The scan driving circuit may be directly formed on the same substrate together with circuit elements of an active area that constitute a screen. The circuit elements of the active area form a pixel circuit in each pixel arranged in a matrix form by the data lines and the scan lines of a pixel array. Each of the circuit elements and the scan driving circuit of the active area includes a plurality of transistors.

In recent years, research has been conducted for developing a new type of display device to meet the needs of a user who wants new and various functions. For example, there is a flexible display device in which a shape of a display panel on which an image is displayed may be deformed. In a case of a flexible display device, a user may apply force to deform the shape of the display device, and various usage methods exist according to the deformed shape of the display device.

However, when the shape of a flexible display device is deformed, it is necessary to display the image in accordance with the deformed shape of the display panel, force is always applied to the deformed portion and thus touch information input to the deformed portion is not normally recognized, etc.

SUMMARY

Embodiments of the disclosure provide a display device that provides convenience and portability to a user by displaying an image on a display panel even in a folded state.

In addition, embodiments of the disclosure provide a display device that minimizes deviations between a plurality of force sensing signals, and prevents malfunction of the display device.

In addition, embodiments of the disclosure provide a display device that performs a desired function even with a small force in a folding state.

A display device according to an embodiment of the disclosure includes a display panel that displays an image and outputs force sensing signals in correspondence to an externally applied force, and a controller that converts the force sensing signals into force values and controls the display panel in at least one of a foldable area and an unfoldable area of the display panel based on the force values. The controller includes a first area setting unit that determines whether the display panel is folded based whether the force values are equal to or greater than a first preset reference value as a first condition, and sets the foldable area of the display panel when it is determined that the display panel is folded, and a control unit that controls the display panel in the foldable area when the force values in the foldable area are equal to or greater than a second reference value after the foldable area is set.

According to an embodiment, in determining whether the display panel is folded, the first area setting unit determines whether points at which the force values are equal to or greater than the first reference value form a folding line as a second condition, and determines whether the force values are sensed for a preset first reference time or longer as a third condition.

According to an embodiment, the controller generates the force values by amplifying, with a first amplification value before the foldable area is set, a difference of each of the force sensing signals and a first base signal, and the controller may generate the force values by amplifying, with a second amplification value after the foldable area is set, a difference between each of the force sensing signals in the foldable area and a second base signal.

According to an embodiment, the second base signal is greater than the first base signal.

According to an embodiment, the second amplification value is greater than the first amplification value.

According to an embodiment, the control unit may calculate a curvature of the foldable area based on the force values in the foldable area, and determine the second base signal based on the curvature.

According to an embodiment, the second base signal is increased in magnitude as the curvature corresponding to the foldable area increases.

According to an embodiment, the second reference value is equal to or less than the first reference value.

According to an embodiments, the display panel may include a force sensor that senses the externally applied force and outputs at least one force sensing signal, and the controller further includes a first amplifier that amplifies the received force sensing signal, and an analog-digital converter that receives the amplified force sensing signal and outputs at least one force value.

According to an embodiment, a first terminal of the first amplifier receives the at least one force sensing signal, a second terminal of the first amplifier receives the first base signal, and a gain of the first amplifier is the first amplification value.

According to an embodiment, the controller further includes a second amplifier that amplifies the received at least one force sensing signal, and a switching module that connects the force sensor to one of the first amplifier or the second amplifier, a first terminal of the second amplifier receives the at least one force sensing signal, a second terminal of the second amplifier receives the second base signal, and a gain of the second amplifier is the second amplification value.

According to an embodiment, the control unit transmits a first connection instruction signal that connects the force sensor and the first terminal of the first amplifier to the switching module, before the foldable area is set, and the control unit transmits a second connection instruction signal that connects the force sensor and the first terminal of the second amplifier to the switching module, after the foldable area is set.

A display device according to another embodiment of the disclosure includes a display panel that displays an image and outputs force sensing signals in correspondence to an externally applied force; and a controller that converts the force sensing signals into force values and controls the display panel in at least one of a foldable area and an unfoldable area of the display panel based on the force values. The controller includes a first area setting unit that determines whether the display panel is folded based on whether the force values are equal to or greater than a first preset reference value as a first condition, and sets the foldable area of the display panel when it is determined that the display panel is folded; and a control unit that calculates a curvature of the foldable area based on the force values in the foldable area, and controls the display of the image in a display area in the foldable area based on the curvature.

According to an embodiment, the control unit controls the display in the foldable area when the force values in the foldable area are equal to or greater than a second reference value after the foldable area is set and displays a virtual input button in the display area of the foldable area.

According to an embodiment, the display device further includes a second area setting unit that receives orientation signals that indicates an orientation of a first surface of the display panel, and sets a display limitation area on the first surface based on the orientation signals and the control unit limits the display of the image in the display limitation area.

According to an embodiment, the second area setting unit compares first orientation signals of the first surface before folding the display panel with second orientation signals of the first surface after folding the display panel, and sets the display limitation area based on a comparison result.

According to an embodiment, the second area setting unit sets at least one unfoldable area where the first orientation signal differs from the second orientation signal as the display limitation area.

According to an embodiment, the second area setting unit calculates a folding direction of the first surface based on the force values, and sets at least one foldable area and at least one unfoldable area where the folding direction is in-folded on the first surface as the display limitation area.

According to an embodiment, the control unit controls display in the unfoldable area when the force values in the foldable area are equal to or greater than a second reference value and the force values in the foldable area are sensed for a preset second reference time or longer.

A display device according to another embodiment of the disclosure includes a display panel that displays an image and outputs force sensing signals in correspondence to an externally applied force, a controller that converts the force sensing signals into force values, determines whether the force values are equal to or greater than a first preset reference value as a first condition, determines whether points where the force values are sensed form a folding line a second condition, determines whether the force values are sensed for a preset first reference time or longer as a third condition, and determines that the display panel is folded about the folding line when the first to third conditions are satisfied and a lookup table that stores display control information for the folding lines of different positions. The controller controls the display panel based on display control information that corresponds to a position of the folding line.

Specific details of other embodiments are included in the detailed description and drawings.

As described above, embodiments of the disclosure provide a display device that provides convenience and portability to a user by displaying an image in a folded area and an unfolded area of a display panel even in a folded state.

In addition, embodiments of the disclosure provide a display device that minimizes deviations between a plurality of force sensing signals and prevents malfunction of the display device.

In addition, embodiments of the disclosure provide a display device that performs a desired function even with a small force in a folded state.

BRIEF DESCRIPTION OF THE DRAWINGS

FIGS. 4 to 6 illustrate a disposition of a force sensor according to an embodiment of the disclosure.

DETAILED DESCRIPTION OF EXEMPLARY EMBODIMENTS

Figure 1:
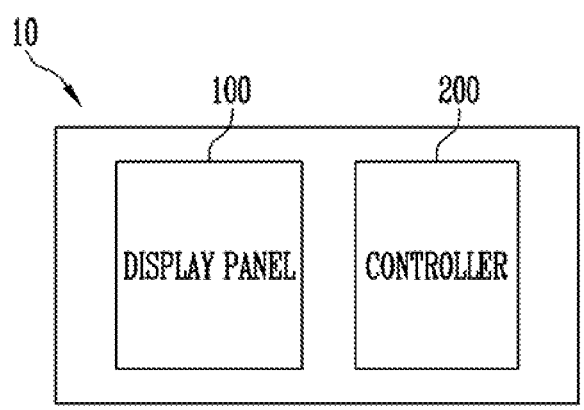
FIG. 1 schematically illustrates a display device according to an embodiment of the disclosure.

Features of embodiments of the disclosure and methods of achieving them will become apparent with reference to exemplary embodiments described in detail below together with the accompanying drawings. However, embodiments of the disclosure are not limited to exemplary embodiments disclosed below, and may be implemented in various different forms. Exemplary embodiments of the disclosure are provided so that those skilled in the art to which the disclosure pertains can fully understand the scope of the disclosure. Embodiments of the disclosure are defined by the scope of the claims.

A case in which an element or a layer is referred to as "on" another element or layer may include a case in which another layer or another element is disposed directly on the other element or between the other layers. The same reference numerals may denote the same components throughout the specification.

The following embodiment may be incorporated into various display devices such as an organic light emitting display device, a liquid crystal display device, a field emission display device, or an electrophoretic device.

Hereinafter, exemplary embodiments of the disclosure will be described in detail with reference to the accompanying drawings. The same or reference numerals may be used for the same components in the drawings.

FIG. 1 schematically illustrates a display device 10 according to an embodiment of the disclosure.

Referring to FIG. 1, the display device 10 according to an embodiment of the disclosure includes a display panel 100, a controller 200, etc.

According to an embodiment, the display panel 100 displays an image. Specifically, the display panel 100 receives input signals for displaying the image and displays the image at an appropriate driving timing according to the input signal.

The display panel 100 according to an embodiment of the disclosure can be folded. Here, folded or folding in the present specification means a case where a folding angle of the display panel 100 is equal to or greater than a predetermined value. For example, a folded display panel 100 refers to a state in which the folding angle of the display panel 100 is 180 degrees based on a case where the folding angle of the display panel 100 is 0 degrees when the display panel is unfolded. However, embodiments of the disclosure are not limited thereto and a case where the folding angle of the display panel 100 is less than 180 degrees may also refer to a folded display panel 100. In addition, a folded display panel 100 can have the same meaning as a folded display device 10, and the folded display panel 100 and the folded display device 10 may be mixed.

In addition, according to an embodiment, the display panel 100 outputs force sensing signals for each point to which force is applied in correspondence with an externally applied force. Here, the force is generated when a user touches the display panel 100 and is generated at a folded portion when the user folds the display panel 100. The force sensing signal is an electrical signal that corresponds to the sensed force and is an analog signal.

According to an embodiment, the controller 200 receives an external input signal for an image frame and controls the display so that the display panel 100 displays the image. Here, controlling the display refers to visualizing a function performed by software such as an application or a program through the display panel 100. For example, when a playback program that plays a video, music, etc., is executed and the playback program performs a function of playing a video, an image, or etc., the display control refers to displaying a video an image, or etc., on the display panel 100. However, embodiments of the disclosure are not limited thereto.

In addition, according to an embodiment, the controller 200 converts the force sensing signals into force values, and controls the display in at least one area of a folded area FA or an unfolded area UFA of the display panel 100 based on the converted force values. Here, the force value refers to a value obtained by digitalizing the analog force sensing signal by an analog-digital converter (hereinafter, referred to as "ADC"), etc. At this time, the force sensing signal may be amplified by an amplifier, etc., and then converted into a force value. The foldable area refers to an area of a predetermined range in which the display panel 100 can be folded and has a predetermined curvature, and the unfoldable area refers to an area other than the foldable area in the display panel 100. In addition, in the present specification, controlling the display by the controller 200 refers to outputting control signals to the display panel 100 for performing functions such as displaying the image on the display panel 100.

For example, according to an embodiment, the controller 200 converts the analog force sensing signals into digital force values, compares the converted force values with a preset reference value, and displays the image on the unfolded display panel 100 based on a comparison result. Here, the reference value refers to a digital value for the controller 200 to perform a specific control operation. At this time, the specific control operation means that specific software, such as news, an email, video playback, music playback, or a game, etc., is executed by input of force, or means that a specific function such as scrolling, mail sending, video pausing, or adjusting music volume, etc., is performed in an al ready executed specific software. There can be a plurality of reference values that are respectively set in correspondence with a plurality of software, and the plurality of reference values can be set differently for each of the plurality of software. However, embodiments of the disclosure are not limited thereto.

In addition, in another embodiment, the controller 200 converts the force sensing signals into the force values, and controls the display in at least one of the foldable area or the unfoldable area of the display panel 100 by using a force value corresponding to the foldable area of the display panel 100 and a second reference value different from the first reference value. Here, the first reference value is a digital value for recognizing that the display panel 100 is folded. The second reference value is a digital value for executing a specific control operation in the folded display panel 100, and is partially set in the foldable area of the display panel 100 when the display panel 100 is folded.

For example, according to an embodiment, when a user applies force to the foldable area of the display panel 100 of the folded display device 10, the controller 200 converts the force sensing signals output by the display panel 100 and displays the image in the foldable area when the force values that correspond to the foldable area of the display panel 100 are equal to or greater than the second reference value. However, embodiments of the disclosure are not limited thereto.

For another example, according to an embodiment, when a user applies force to the foldable area of the display panel, the controller 200 scrolls the image displayed in the unfoldable area when the force values corresponding to the foldable area of the display panel 100 are equal to or greater than the second reference value. However, embodiments of the disclosure are not limited thereto.

In addition, according to an embodiment, when the controller 200 converts the force sensing signal a force value, the controller 200 generates the force values by amplifying the force sensing signal through an amplification process that differs depending on whether the display device has been folded.

A detailed description of an operation of the controller 200 will be described below with reference to FIGS. 8 to 14.

In addition, the display device 10 according to an embodiment of the disclosure includes a plurality of data lines, a plurality of scan lines, a plurality of light emission control lines, a data driver that outputs data voltages through the plurality of data lines, a scan driver that outputs scan signals through the plurality of scan lines, a light emission driver that outputs light emission control signals through the plurality of light emission control lines, a memory that stores various data items, a processor, etc.

In addition, the display device 10 according to an embodiment of the disclosure further includes an orientation sensor that senses orientation information of the display panel 100 and outputs an orientations signal. Here, the orientation sensor is an inertial measurement unit (IMU) such as a gyroscope, an acceleration sensor, or a geomagnetic sensor. However, embodiments of the disclosure are not limited thereto.

According to an embodiment, when the orientation sensor senses an inclination of the display device 10 the display device 10 limits the display of the image on a portion of the folded display panel 100 based on inclination information.

As described above, the display device 10 according to an embodiment of the disclosure provides convenience to a user by displaying the image in the foldable area and the unfoldable area of the display panel 100 even in a folded state.

Hereinafter, the display panel 100 according to an embodiment of the disclosure will be specifically described.

Figure 2:
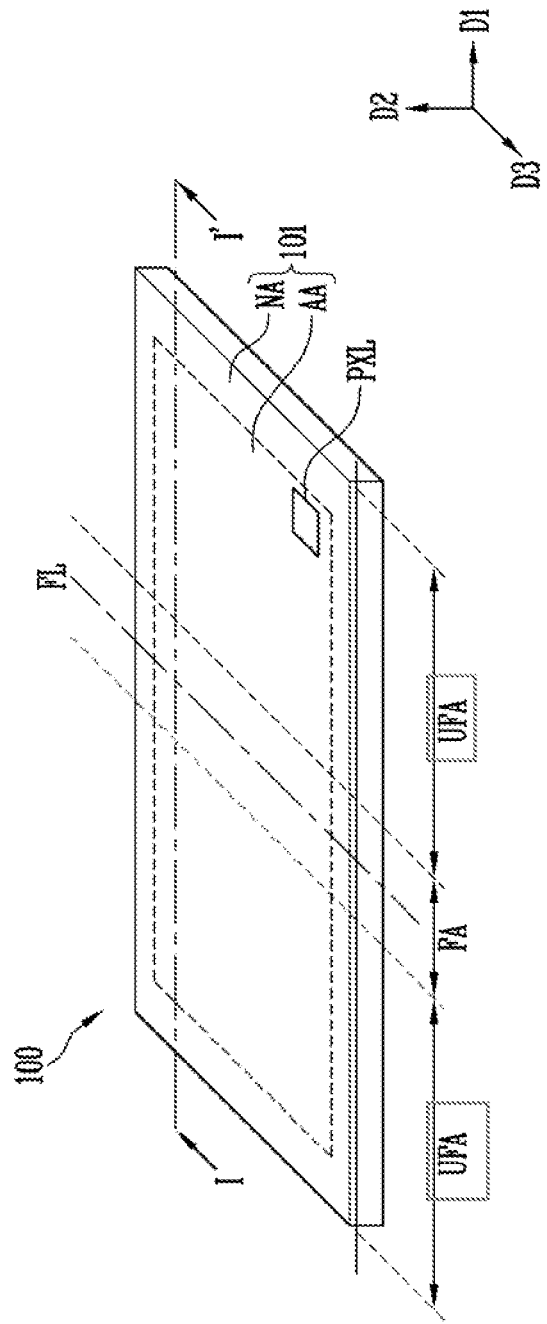
FIG. 2 is a perspective view of a display panel according to an embodiment of the disclosure.
Figure 3:
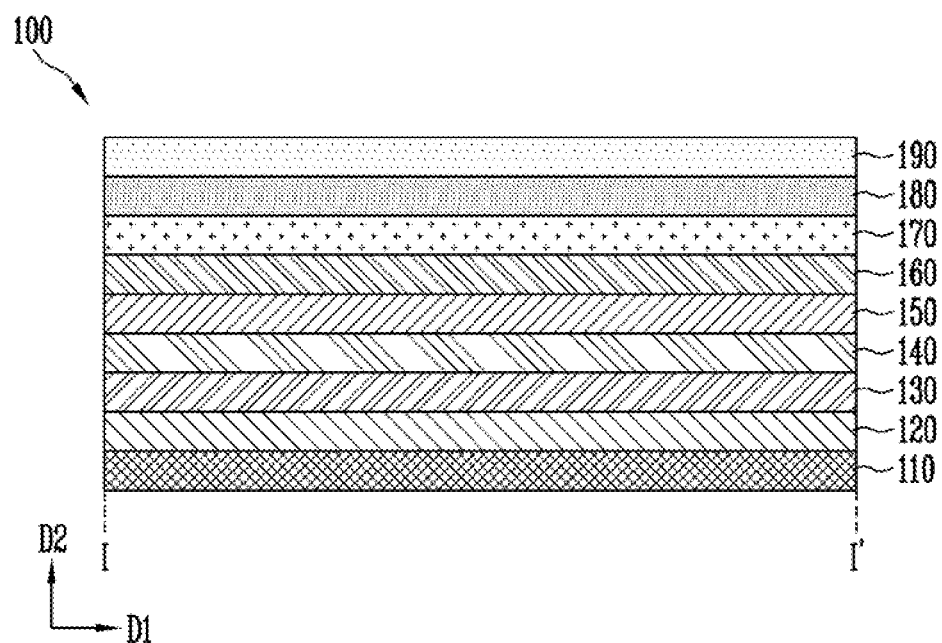
FIG. 3 is a cross-sectional view of a display panel of FIG. 2.

FIG. 2 is a perspective view of the display panel 100 according to an embodiment of the disclosure, and FIG. 3 is across-sectional view of the display panel 100 of FIG. 2.

Referring to FIG. 2, the display panel 100 according to an embodiment of the disclosure has a rectangular shape having a finite length in each of a first direction D1, a second direction D2, and a third direction D3. Specifically, the shape of the display panel 100 is that of a plane parallel to the first direction D1 and the second direction D2, a plane parallel to the second direction D2 and the third direction D3, and a plane parallel to the first direction D1 and the third direction D3. However, embodiments of the disclosure are not limited thereto, and the shape of the display panel 100 shown in FIG. 2 is merely an example. Hereinafter, embodiments of the disclosure will be described based the shape of the display panel 100 shown in FIG. 2 for convenience.

According to an embodiment, the display panel 100 includes a first surface 101 that faces the second direction D2 and a second surface that faces a direction opposite to the second direction D2. Here, the first surface 101 includes a display area (active area) AA and a non-display area (non-active area) NA.

According to an embodiment, the display area AA is an area for displaying an image. Specifically, the display area AA is an area where a plurality of colors, such as red green, blue, etc., emitted by a plurality of pixels PXL. Here, the pixel PXL is formed by a data line and a scan line. The pixel PXL includes a transistor, a capacitor, a light emitting diode, etc.

According to an embodiment, the non-display area NA is an area where no image is displayed. The non-display area NA includes the data driver, the scan driver, the light emission driver, etc.

According to an embodiment the display panel 100 includes a folding line FL, and the foldable area FA and the unfoldable area UFA have a predetermined range with respect to the folding line FL. Here, the folding line FL is formed by points where the force is applied to the display panel 100.

According to an embodiment, the display panel 100 has a structure in which a plurality of members are sequentially stacked.

Referring to FIG. 3, according to an embodiment, the display panel 100 includes a first substrate 110, a force sensor 120 disposed on the first substrate 110, a second substrate 130 disposed on the force sensor 120, a TFT circuit layer 140 disposed on the second substrate 130, a light emitting element layer 150 disposed on the TFT circuit layer 140, an encapsulation layer 160 disposed on the light emitting element layer 150, a polarizer 170 disposed on the encapsulation layer 160, a third substrate 180 disposed on the polarizer 170, a fourth substrate 190 disposed on the third substrate 180, etc.

According to an embodiment, the first substrate 110 is flexible, and is formed of a material such as thermoplastic polyurethane. In addition, the first substrate 110 has a structure in which a plurality of films are stacked, and may include one of a film substrate and a plastic substrate that includes a polymer organic material.

According to an embodiment, the force sensor 120 senses a force and outputs at least one force sensing signal. Specifically, the force sensor 120 can sense an externally applied force and output a force sensing signal that indicates the sensed force. Here, the force sensor 120 may be, for example, a force sensitive resistor (FSR) pressure sensor in which a resistance value changes according to physical force, weight, etc., an electronic pressure sensor (or strain gauge sensor) that measures a resistance according to deformation of force, a piezoelectric sensor that uses a piezoelectric effect, etc. However, embodiments of the disclosure are not limited thereto.

According to an embodiment, the force sensor 120 is disposed on the first substrate 110 as shown in FIG. 3, but embodiments are not limited thereto. The force sensor 120 may be freely disposed within the stack in a cross section I-I' of the display panel 100. For example, the force sensor 120 can be disposed below the first substrate 110, can be disposed between the third substrate 180 and the fourth substrate 190, and can be disposed below the third substrate 180. However, embodiments of the disclosure are not limited thereto.

According to an embodiment, the second substrate 130 is flexible substrate, like the first substrate 110. Specifically, the second substrate 130 is one of a film substrate or a plastic substrate that includes a polymer organic material. For example, the second substrate 130 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, or cellulose acetate propionate.

According to an embodiment, the TFT circuit layer 140 is a circuit layer that forms a thin-film transistor.

According to an embodiment, the light emitting element layer 150 emits light by an operation of the TFT circuit layer 140. The light emitting element layer 150 include one of an organic light emitting element or an inorganic light emitting element, etc.

According to an embodiment, the encapsulation layer 160 prevents penetration of foreign substances such as moisture and air into the light emitting element layer 150. The encapsulation layer 160 includes an inorganic material that includes one or more of silicon oxide (SiOx), silicon nitride (SiNx), silicon oxynitride (SiONx), and has a multilayer structure that includes the above-described inorganic material and an organic material selected from epoxy, acrylate, or urethane acrylate.

According to an embodiment, the polarizer 170 reduce reflection of externally incident natural light. Since the reflected light is partially blocked by the polarizer 170, the image displayed on the display panel 100 will be more clear.

According to an embodiment, the third substrate 180 is a flexible transparent insulating substrate and is formed of a transparent plastic material, such as polyimide.

According to an embodiment the fourth substrate 190 protects against external impacts. The fourth substrate 190 is a sealing substrate or a protective substrate. The fourth substrate 190 is formed of a transparent material such as glass or plastic, and is flexible.

According to an embodiment, the stack structure of the display panel 100 shown in FIG. 3 is exemplary, each layer may have a multilayer structure or a single layer structure, another layer may be further added, or some layers may be omitted as necessary.

In addition, according to an embodiment, an adhesive layer is included between the layers. The adhesive layer combines a layer disposed above the adhesive layer and a layer disposed below the adhesive layer. The adhesive layer includes an adhesive film that has an adhesive property, such as an optically clear adhesive (OCA). For another example, the adhesive layer includes an optically clear resin (OCR).

Hereinafter, an embodiment related to a disposition of the force sensor 120 will be described.

Figure 4:
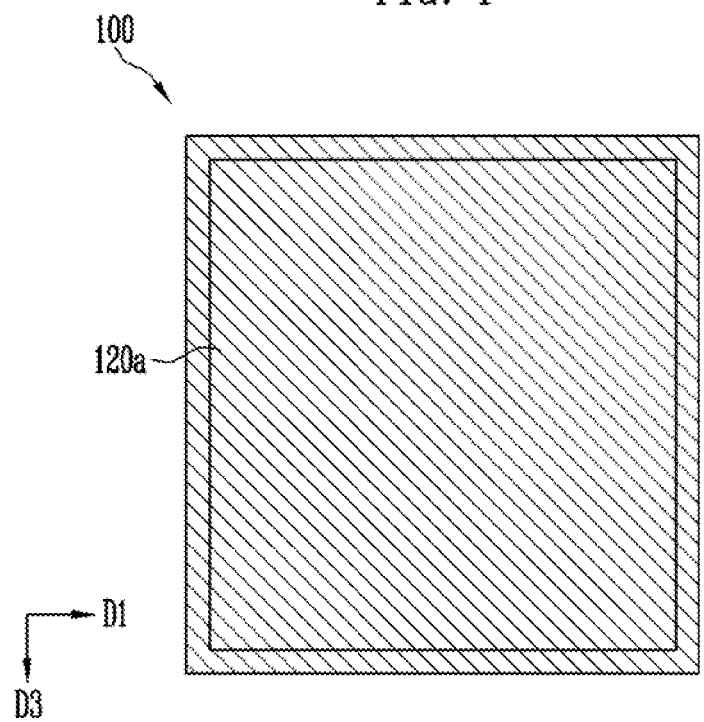

FIGS. 4 to 6 illustrate a disposition of a force sensor 120a according to an embodiment of the disclosure.

Referring to FIGS. 2 to 4, according to an embodiment, the force sensor 120a covers an entirety of the display area AA. For example, the force sensor 120a is disposed at a lower portion of the first surface 101 of the display panel 100.

According to an embodiment, referring to FIGS. 2, 3, and 5, the force sensor 120b has a line shape that extends in one direction in the display panel 100. For example, one or more force sensors 120b are disposed at a lower portion of the first surface 101 of the display panel 100 and extend parallel to the first direction D1. For another example, one or more force sensors 120b are disposed at the lower portion of the first surface 101 of the display panel 100 and extend parallel to the third direction D3.

Here, according to an embodiment, the force sensor 120b has a shape of one line as shown in FIG. 5, but embodiments are not limited thereto, and in other embodiments, there may be a plurality of line shaped force sensors 120b. At this time, the plurality of line shapes may extend parallel to the first direction D1, may extend parallel to the third direction D3, or may extend in an oblique direction that is not parallel to either of the first direction D1 or the third direction D3.

According to an embodiment, referring to FIGS. 2, 3, and 6, a force sensor 120c is disposed at an edge of the display panel 100. That is, the force sensor 120c is disposed at an edge of the lower portion of the first surface 101 of the display panel 100.

The dispositions of the force sensors 120a, 120b, and 120c shown in FIGS. 4 to 6 are illustrative for the purpose of explaining embodiments of the present disclosure, but embodiments are not limited to those shown in FIGS. 4 to 6.

According to an embodiment, when the user folds the display device 10, the force applied to the display panel 100 is sensed by the force sensors 120a, 120b, and 120c. When the display device 10 is folded, the force or pressure of the folding is applied to the foldable area FA and the display device 10 may not recognize the additional forces generated by the user even though the user touches or applies the additional force to the foldable area FA.

Figure 7:
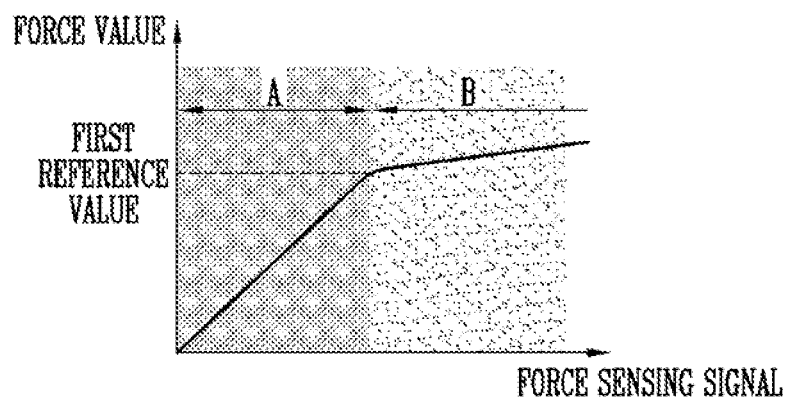
FIG. 7 is a graph that illustrates a force value according to a force sensing signal of the related art.

FIG. 7 is a graph that illustrates a force value according to the force sensing signal of the related art.

Referring to FIG. 7, before the foldable area FA is folded (A), the force sensing signal output by the force sensor 120 is converted into a force value. At this time, when the force sensing signal is converted into a force value, the force sensing signal is amplified by an amplifier. In addition, it is determined whether or not the display device 10 is being folded according to a comparison result between the converted force value and a first reference value. When the converted force value is equal to or greater than the first reference value, it is recognized that the display device 10 is being folded.

After the foldable area FA is folded (B), the force of the folded state is applied to the foldable area FA of the display panel 100. At this time, a level of the force recognizable by the force sensor 120 is close to a saturation level. Therefore, even though an additional force, such as a user's touch, is externally applied, an increase rate of the force sensing signal is less than before the foldable area FA was folded (A). In addition, since the force value recognized in the folded state is greater than the first reference value, when the user touches the foldable area FA of the display panel 100, the display device 10 can malfunction.

Therefore, even though the display device 10 is folded, the display device 10 needs to maintain the increase rate of the force sensing signal or the degree of recognition of the force sensing signal with respect to the additionally applied force. In addition, even after the display device 10 is folded, the display device 10 needs to normally operate even though a user applies a relatively small force.

Figure 8:
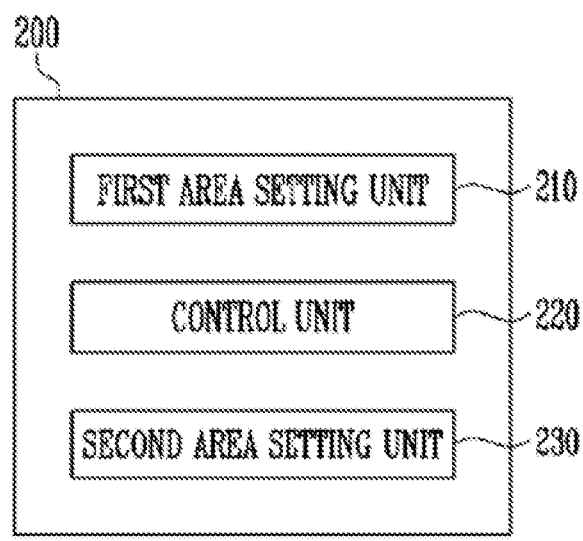
FIG. 8 schematically illustrates a controller according to an embodiment of the disclosure.

FIG. 8 schematically illustrates a controller 200 according to an embodiment of the disclosure.

Referring to FIG. 8, according to an embodiment, the controller 200 include a first area setting unit 210, a control unit 220, etc.

According to an embodiment, the first area setting unit 210 determines whether the display panel 100 is folded based on whether the force values are equal to or greater than the preset first reference value. Here, the first reference value is as described above with reference to FIG. 1.

Here, according to an embodiment, since the folding line FL is formed when the display panel 100 is folded as described above with reference to FIG. 2, the condition for determining whether the display panel 100 is folded includes determining whether the points where the force is sensed in the display panel 100 form the folding line FL. In addition, since a folded state of the display panel 100 i is generally a state in which a force is applied to the display panel 100 for a predetermined period of time or longer, the condition for determining whether the display panel 100 is folded includes determining a time period when the force is sensed.

Specifically, according to an embodiment, when the first area setting unit 210 determines that the display panel 100 has been folded, the first area setting unit 210 determines that the points where the force values equal to or greater than the first reference value form the folding line FL is a second condition, and determine that the time period when the force values are sensed for a predetermined first reference time or longer is a third condition.

According to an embodiment, when it is determined that the display panel 100 is folded, the first area setting unit 210 sets the foldable area FA in the display panel 100. Here, since the unfoldable area UFA is the remaining area in the display panel 100, the first area setting unit 210 simultaneously sets the foldable area FA and the unfoldable area UFA. That is, phrase setting the foldable area FA includes setting the unfoldable area UFA.

According to an embodiment, when the foldable area FA is set, the control unit 220 controls the display in the foldable area FA when the force values in the foldable area FA are equal to or greater than the second reference value. Here the controlling the display refers to controlling the display of an image in the display area AA of the display panel 100, etc., as described above.

For example, according to an embodiment, when the user applies a force to the foldable area FA of the display panel 100, the control unit 220 determines whether the force values are equal to or greater than the second reference value, and when the force values are equal to or greater than the second, reference value, the control nit 220 displays time information in the foldable area FA. However, embodiments of the disclosure are not limited thereto.

In addition, according to an embodiment the control unit 220 controls the display of the foldable area FA when the display panel 100 is folded regardless of whether the force values in the foldable area FA are equal to or greater than the second reference value. For example, when the display panel 100 is folded, the control unit 220 displays a virtual input button such as a volume button or a voice instruction button the foldable area FA. However, embodiments of the disclosure are not limited thereto.

According to an embodiment, the controller 200 further includes a second area setting unit 230.

According to an embodiment, the second area setting unit 230 receives orientation signals that indicate an orientation of the first surface 101 of the display panel 100 and set a display limitation area on the first surface 101 based on the orientation signals. Here, the first surface 101 of the display panel 100 includes the display area AA where an image is displayed as described above with reference to FIG. 2. In addition, the orientation signal is output by the above-described orientation sensor. The display limitation area is a display area AA that is not visible to the user when the display device 10 is folded.

For example, according to an embodiment, the second area setting unit 230 compares the orientation of the first surface 101 of the display panel 100 before being folded with the orientation of the first surface 101 of the display panel 100 after being folded, and sets the as the display limitation area the display area AA in the first surface 101 that has different orientations before and after being folded.

In addition, according to an embodiment, the second area setting unit 230 calculates a folding direction of the display panel 100, and may set the entire display area AA of the first surface 101 as the display limitation area based on the folding direction information or set a portion of the display area AA of the first surface 101 as the display limitation area. Here, the folding direction includes an in-folded direction in which the display panel 100 is folded so that the first surfaces 101 of the display panel 100 shown in FIG. 2 face each other, and an out-folded direction in which the display panel 100 is folded so that second surfaces of the display panel 100 face each other.

A detailed description of an operation of the second area setting unit 230 will be described below with reference to FIGS. 16 to 20.

According to an embodiment, when the display limitation area is set, the control unit 220 limits the display of the image to the display limitation area.

Hereinafter, an operation of generating force values by the controller 200 before and after folding the display panel 100 will be specifically described in terms of a circuit diagram.

Figure 9:
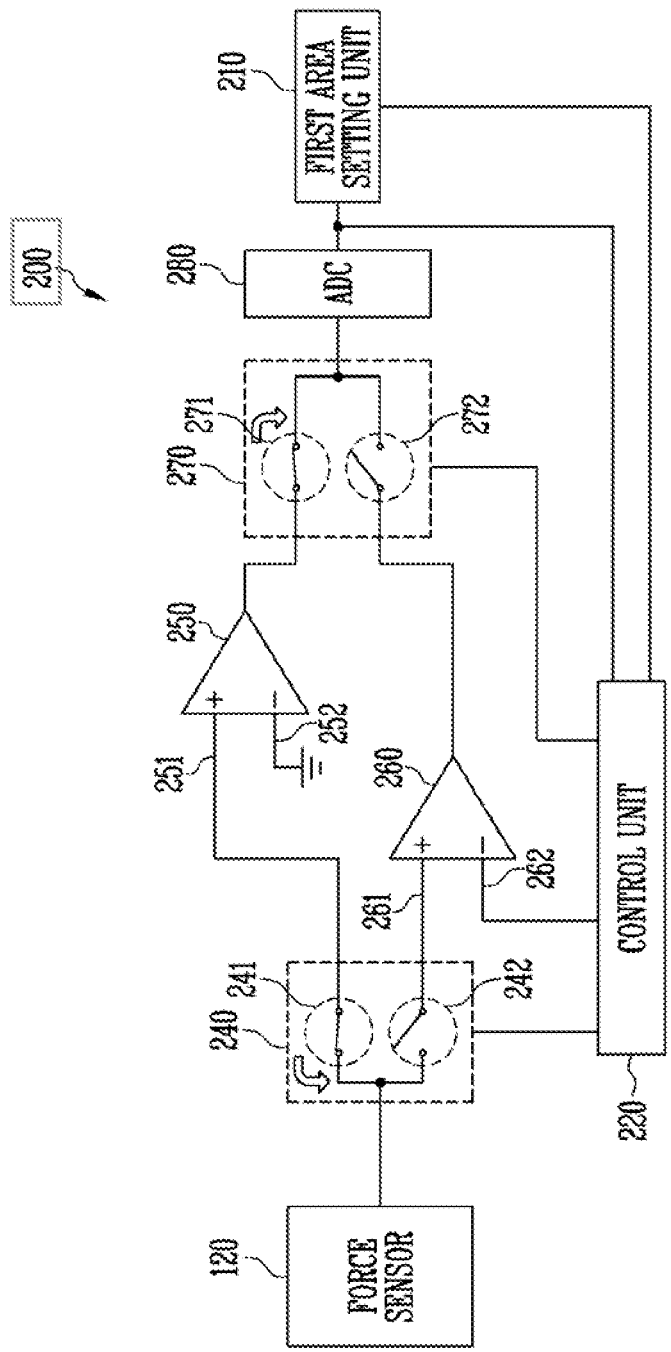
FIG. 9 is a circuit diagram of a controller according to an embodiment of FIG. 8.
Figure 10:
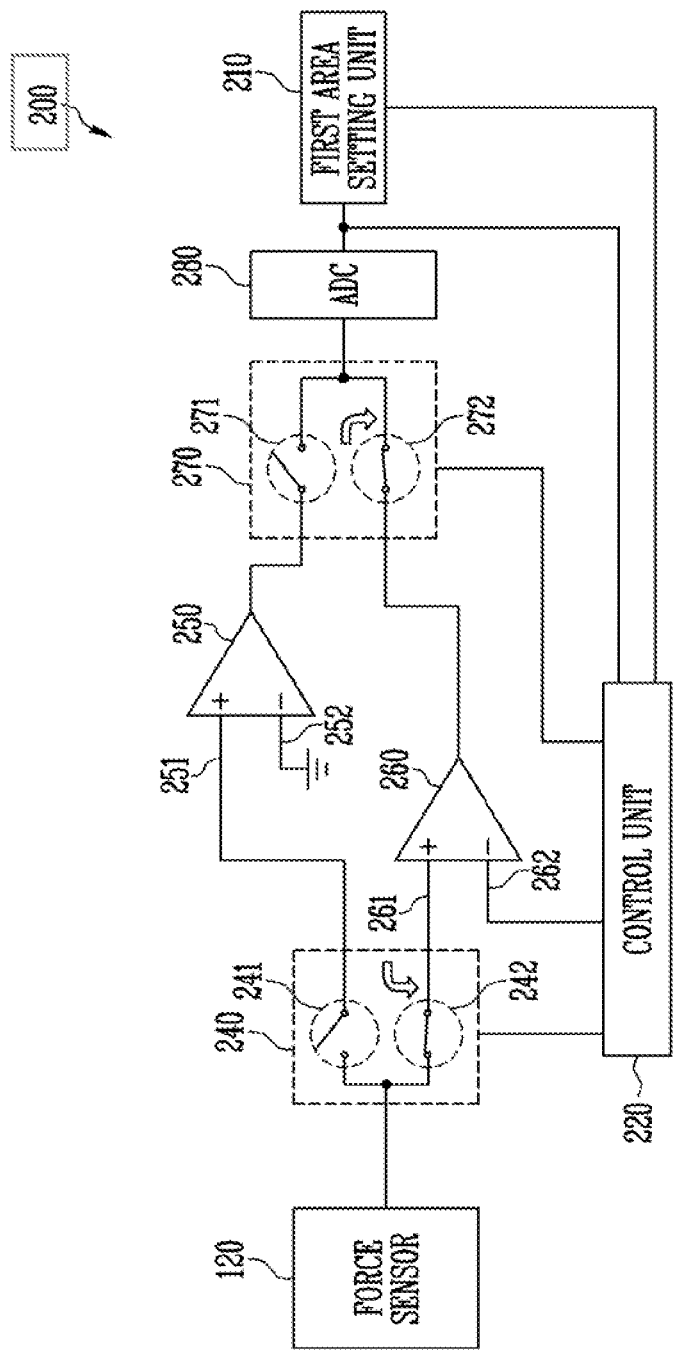
FIG. 10 is another circuit diagram of a controller of according to an embodiment of FIG. 8.

FIG. 9 is a circuit diagram of an embodiment of the controller 200 of FIG. 8 and FIG. 10 is another circuit diagram of an embodiment of the controller 200 of FIG. 8.

Referring to FIGS. 9 and 10, according to an embodiment, before the foldable area FA is set, the controller 200 generates the force values by amplifying with a first amplification value differences between each of the force sensing signals and a first base signal. On the other hand, after the foldable area FA is set, the controller 200 generates the force values by amplifying with a second amplification value differences between each of the force sensing signals and a second base signal.

Here, according to an embodiment, the base signal sets the force sensing signal to a recognizable minimum magnitude. There may be a plurality of the base signals, and the plurality of base signals are set differently according to before or after folding. For example, a corresponding before folding first base signal and a corresponding after folding second base signal may be set.

According to an embodiment, it is assumed that the magnitude of the force sensing signal increases in a positive direction as a level of the force sensed by the force sensor 120 increases. At this time, the first base signal is less than the second base signal. For example, when the first base signal corresponds to a reference voltage signal, the second base signal is a voltage signal whose magnitude is greater than that of the reference voltage signal.

According to an embodiment, when implementing the above-described function in a circuit, the controller 200 includes a first amplifier 250. The first amplifier 250 receives the force sensing signal from the force sensor 120 and amplifies the received force sensing signal. The first amplifier 250 operates until the foldable area FA is set. A first terminal 251 of the first amplifier 250 receives the force sensing signal, a second terminal 252 of the first amplifier 250 receives the first base signal, and a gain of the first amplifier 250 is the first amplification value. For example, non-inverting terminal 251 of the first amplifier 250 receives the force sensing signal, an inverting terminal 252 of the first amplifier 250 is connected to the reference voltage signal, such as a ground voltage, and the gain of the first amplifier 250 is 1. However, embodiments of the disclosure are not limited thereto.

According to an embodiment, the controller 200 further includes an analog-to-digital convertor (ADC) 280. The ADC 280 receives the force sensing signal amplified by the first amplifier 250 and outputs at least one force value. In addition the ADC 280 outputs the generated force value to the first area setting unit 210 and to the control unit 220.

According to an embodiment, the controller 200 further includes a second amplifier 260. The second amplifier 260 receives the force sensing signal from the force sensor 120 and amplifies the received force sensing signal. The second amplifier 260 operates after the foldable area FA is set. A first terminal 261 of the second amplifier 260 receives the force sensing signal, a second terminal 262 of the second amplifier 260 receives the second base signal, and a gain of the second amplifier 260 is the second amplification value, which is greater than the first amplification value. For example, a non-inverting terminal 261 of the second amplifier 260 receives the force sensing signal, an inverting terminal 262 of the second amplifier 260 receives the second base signal output from the control unit 220, and the gain of the second amplifiers 260 is a value greater than 1. However, embodiments of the disclosure are not limited thereto.

According to an embodiment, the controller 200 further includes a first switching module 240 that connects the force sensor 120 to one of the first amplifier 250 and the second amplifier 260. Before the foldable area FA is set, the first switching module 240, under control of the control unit 220, connects the force sensor 120 to the first amplifier 250 and disconnects the force sensor 120 and the second amplifier 260. In addition, after the foldable area FA is set, the first switching module 240, under control of the control unit 220, disconnects the force sensor 120 and the first amplifier 250 and connects the force sensor 120 to the second amplifier 260. The first switching module 240 includes a first switch 241 that connects or disconnects the force sensor 120 and the first amplifier 250, and a second switch 242 that connects or disconnects the force sensor 120 and the second amplifier 260.

Referring to FIG. 9, according to an embodiment, for example, before the foldable area FA is set, the control unit 220 transmits a first connection instruction signal to the first switching module 240 to connect the force sensor 120 and the first terminal 251 of the first amplifier 250. At this time, the first switch 241 connects the force sensor 120 to the first terminal 251 of the first amplifier 250, and the second switch 242 disconnects the force sensor 120 and the first terminal 261 of the second amplifier 260.

Referring to FIG. 10, according to an embodiment, for example, after the foldable area FA is set, the control unit 220 transmits a second connection instruction signal to the first switching module 240 to connect the force sensor 120 and the first terminal 261 of the second amplifier 260. At this time, the first switch 241 disconnect the force sensor 120 and the first terminal 251 of the first amplifier 250, and the second switch 242 connects the force sensor 120 to the first terminal 261 of the second amplifier 260.

According to an embodiment, the controller 200 further includes a second switching module 270 that connects the ADC 280 to one of the first amplifier 250 or the second amplifier 260. Before the foldable area FA is set, the second switching module 270, under control of the control unit 220, connects the first amplifier 250 to the ADC 280 and disconnects the ADC 280 and the second amplifier 260. In addition, after the foldable area FA is set, the second switching module 270, under control of the control unit 220, disconnects the first amplifier 250 and the ADC 280 and connects the ADC 280 to the second amplifier 260. The second switching module 270 includes a third switch 271 that connects or disconnects the ADC 280 and the first amplifier 250, and a fourth switch 272 that connects or disconnects the ADC 280 and the second amplifier 260.

Referring to FIG. 9, according to an embodiment, before the foldable area FA is set, the control unit 220 transmits a third connection instruction signal to the second switching module 270 to connect the ADC 280 and an output terminal of the first amplifier 250. At this time, the third switch 271 connects the ADC 280 to the output terminal of the ADC 280, and the fourth switch 272 disconnects the ADC 280 and the output terminal of the second amplifier 260.

Referring to FIG. 10, according to an embodiment, after the foldable area FA is set, the control unit 220 transmits a fourth connection instruction signal to the second switching module 270 to connect the ADC 280 and an output terminal of the second amplifier 260. At this time, the third switch 271 disconnects the ADC 280 and the output terminal of the first amplifier 250, and the fourth switch 272 connects the ADC 280 to the output terminal of the second amplifier 260.

Figure 12:
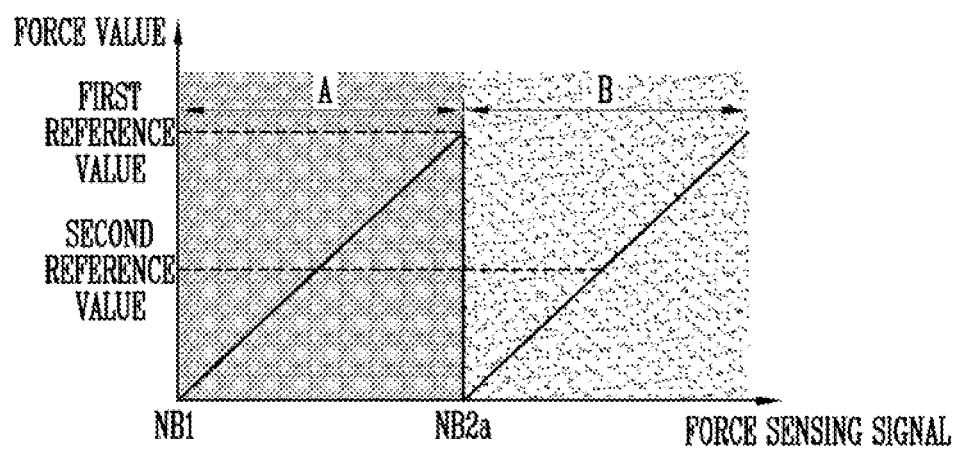
FIG. 12 is a graph schematically of force values according to the force sensing signal before and after folding the display device shown in FIG. 11.
Figure 13:
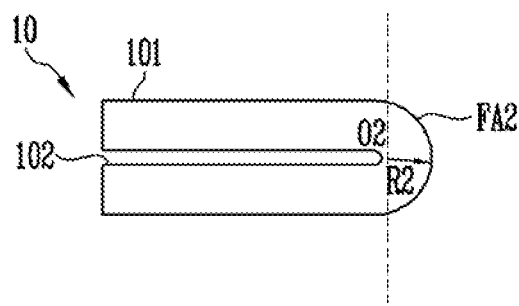
FIG. 13 schematically illustrates a display device according to an embodiment of the disclosure that is folded with a second curvature.

In addition, according to an embodiment of the disclosure, since the number of force values to be expressed is small (compare FIG. 7 with FIG. 12), the controller 200 can use a low resolution ADC and thus reduce a manufacturing cost (refer to FIGS. 12 and 13).

In addition, according to an embodiment of the disclosure, the controller 200 enables operation of the display device 10 and provides convenience to the user by amplifying the received force sensing signal even though a relatively small force is applied, when the display device 10 is folded.

In addition, according to an embodiment of the disclosure, the controller 200 prevents a leakage current by controlling the switching module.

In addition, according to an embodiment of the disclosure, the display device 10 can be folded to various curvatures as described above. In this case the force applied to the foldable area FA by the folded state can vary according to the curvature of the foldable area FA. Therefore, the base signal is set differently according to the curvature of the foldable area FA. As described above, the base signal corresponds to a force sensing signal of a recognizable minimum magnitude. Even if the force caused by the folded state is small due to a small curvature, when the base signal is too high, a user's touch input may be ignored. On the other hand, if the force caused by the folded state is large due to a large curvature, when the base signal is too low, the touch input may be incorrectly recognized as a touch input even though the user did not touch.

Hereinafter, an embodiment in which the base signal is set according to the curvature of the folded display device 10 will be specifically described.

Figure 11:
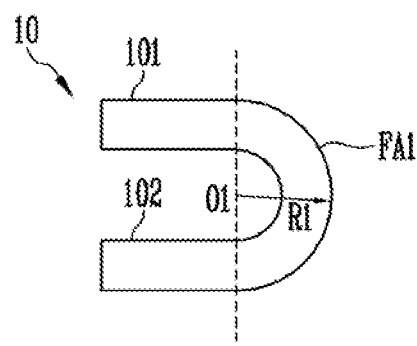
FIG. 11 schematically illustrates a display device according to an embodiment of the disclosure that is folded with a first curvature.

FIG. 11 schematically illustrates the display device 10 according to an embodiment of the disclosure that is folded with a first curvature 1/R1, and FIG. 12 is a graph of the force value according to the force sensing signal before and after folding the display device 10 shown in FIG. 11.

According to an embodiment, the control unit 220 of the controller 200 calculates the curvature of the foldable area FA based on the force values in the foldable area FA, and determines the second base signal based on the curvature.

Referring to FIG. 11, according to an embodiment, for example, when the display device 10 is out-folded so that second surfaces 102 of the display device 10 face each other, the control unit 220 receives force values corresponding to a first foldable area FA1 in the first surface 101, calculates a first radius R1 from a first center O1 to the first foldable area FA1 using the force values, and calculates the first curvature 1/R1, which is an inverse of the first radius R1. In addition, the control unit 220 determines the second base signal according to the first curvature 1/R1.

Referring to FIG. 12, according to an embodiment, before the first foldable area FA1 is set (A), as described above with reference to FIGS. 7 and 9, the force values are generated by amplifying with the first amplification value a difference between each of the force sensing signals and a first base signal NB1, and the converted force value also increases as the force sensing signal increases.

In addition, according to an embodiment, when the above-described first condition of the force values being equal to or greater than the first reference value is satisfied, and the above-described second condition of the points where the force values are sensed forming the folding line FL and the third condition of the force values being sensed for the first reference time or longer are satisfied as necessary, it is determined that the display device 10 is folded and the first foldable area FA1 is set.

According to an embodiment, when the first foldable area FA1 is set as shown in FIG. 11, a second base signal NB2$a$ according to the first curvature 1/R1 of the first foldable area FA1 is generated.

According to an embodiment, after the foldable area is set (B), as described above with reference to FIG. 10, the second base signal is generated and transmitted to the second amplifier 260 shown in FIGS. 9 and 10. In addition, the force values are generated by amplifying with the second amplification value a difference between each of the force sensing signals and the second base signal.

In addition, according to an embodiment, when the force values are equal to or greater than the second reference value, the display is controlled in at least one of the first foldable area FA1 and the unfoldable area UFA of the display panel 100. Here, the second reference value is equal to or less than the first reference value.

Figure 14:
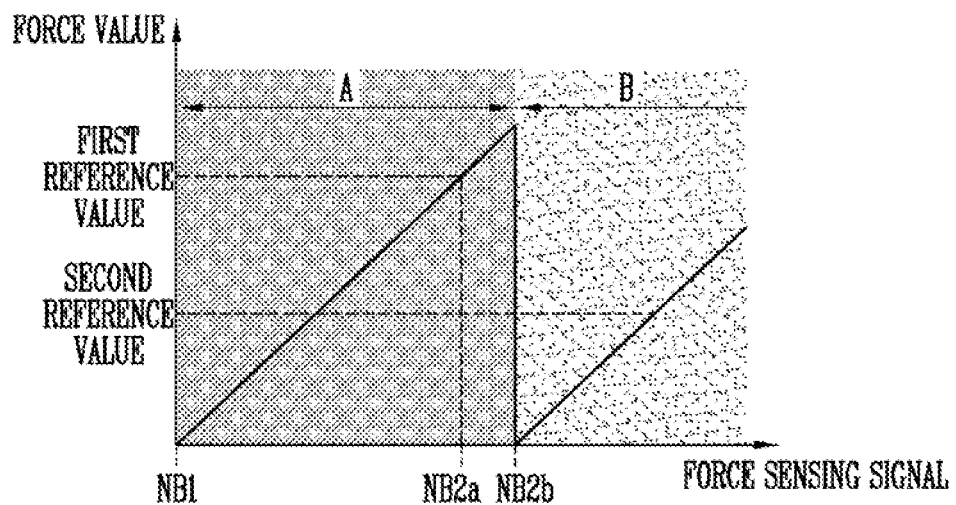
FIG. 14 is a graph schematically of force values according to the force sensing signal before and after folding the display device shown in FIG. 13.

FIG. 13 schematically illustrates the display device 10 according to an embodiment of the disclosure that is folded with a second curvature 1/R2, and FIG. 14 is a graph of the force values according to the force sensing signal before and after folding the display device 10 shown in FIG. 13.

According to an embodiment, the control unit 220 of the controller 200 determines the second base signal based on the curvature of the foldable area as described above with reference to FIG. 11.

Referring to FIG. 13, according to an embodiment, when the display device 10 is out-folded, the control unit 220 receives force values that corresponds to a second foldable area FA2, calculates a second radius R1 from a second center O2 to the second foldable area FA2 using the force values, and calculates the second curvature 1/R2, which is an inverse of the second radius R2. In addition, the control unit 220 determines the second base signal NB2$b$ according to the second curvature 1/R2.

Referring to FIG. 14, according to an embodiment, before the second foldable area FA2 is set (A), as described above with reference to FIGS. 7, 9, and 12, the force values are generated by amplifying each of the force sensing signals, and the force value also increases as the force sensing signal increases.

In addition, according to an embodiment, when the above-described first condition is satisfied, and the second condition and the third condition are satisfied as necessary, it is determined that the display device 10 is folded and the second foldable area FA2 is set.

According to an embodiment, when the second foldable area FA2 is set as shown in FIG. 13, the second base signal NB2$b$ according to the second curvature 1/R2 of the second foldable area FA2 is generated.

According to an embodiment, after the foldable area is set (B), as described above with reference to FIGS. 10 and 12, the second base signal NB2$b$ is generated and transmitted to the second amplifier 260. In addition, the force values are generated by amplifying, with the second amplification value, a difference between each of the force sensing signals and the second base signal.

In addition, according to an embodiment, when the force values are equal to or greater than the second reference value, the display is controlled in at least one of the second foldable area FA2 and the unfoldable area UFA of the display panel 100. Here, the second reference value is equal to or less than the first reference value.

According to an embodiment, the force applied to the foldable area in the folded state increase as the curvature of the foldable area increases. Therefore, the second base signal is increased as the curvature corresponding to the foldable area increases. Referring to FIGS. 11 to 14, for example, since the first curvature 1/R1 is less than the second curvature 1/R2, a magnitude of the first base signal NB2$a$ according to the first curvature 1/R1 is less than a magnitude of the second base signal NB2$b$ according to the second curvature 1/R2.

As described above, according to an embodiment of the disclosure, the controller 200 sets the magnitude of the base signal differently according to the curvature of the foldable area. Therefore the user can easily perform a desired function in the folded display device 10 with a small force.

Figure 15:
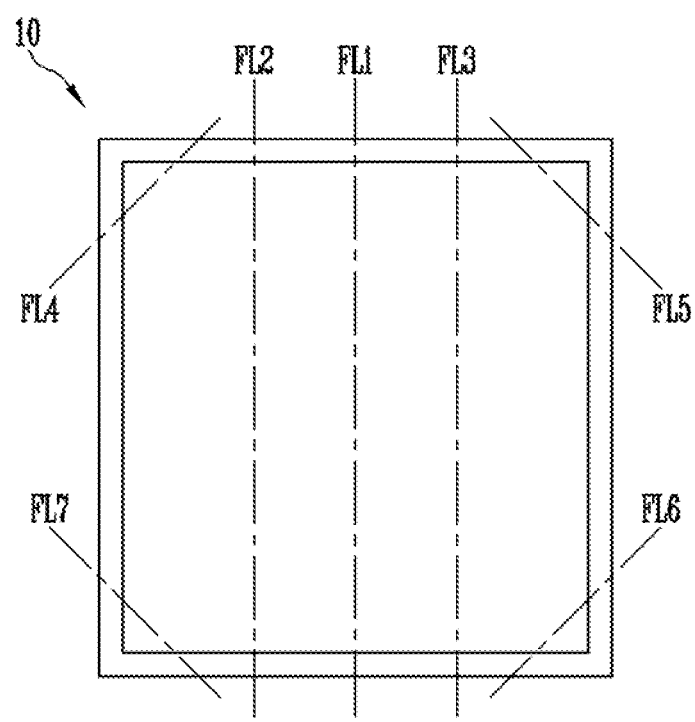
FIG. 15 illustrates folding lines feed in the display device according to an embodiment of the disclosure.

FIG. 15 illustrates folding lines FL1 to FL7 formed in the display device 10 according to an embodiment of the disclosure.

Referring to FIG. 15, according to an embodiment of the disclosure, the display device 10 includes a plurality of folding lines FL1 to FL7. For example, the display device 10 includes first to third folding lines FL1 to FL3 that are parallel to each other, and includes fourth to seventh folding lines FL4 to FL7 that are not parallel to the first to third folding lines FL1 to FL3. However, embodiments of the disclosure are not limited thereto.

Here, according to an embodiment, the display device 10 stores display control information that differs for each of the plurality of folding lines FL1 to FL7. When the display device 10 is folded, the folded display device 10 controls the display according to a corresponding folding line FL.

For example, according to an embodiment, when the display device 10 is folded about the first folding line FL1, the display device 10 changes from a tablet mode that is a first driving mode to a smartphone mode that is a second driving mode.

For another example, according to an embodiment, when the display device 10 is folded based on the fourth folding line FL4, the display device 10 controls the display of the display panel 100 to execute a music playback program and displays the music playback program.

Additionally referring to FIGS. 2 and 6, for still another example, according to an embodiment, when the user touches an edge of the display panel 100 on which the force sensor 120 is disposed, the display device 10 executes a screen division function. In addition, when the user folds the display device 10 about any one of the first to third folding lines FL1 to FL3 and unfolds the display device 10 again within a predetermined time, the display device 10 displays different images in the display areas AA of the display panel 100 divided by the folding line FL.

For still another example, according to an embodiment, when the display device 10 is executing a video playback program and the user folds the display device 10 about the third folding line FL3 and unfolds the display device 10 again within a predetermined time, the display device 10 performs a forward function.

The operations of the display device 10 described above are merely examples and embodiments of the disclosure are not limited thereto.

Figure 16:
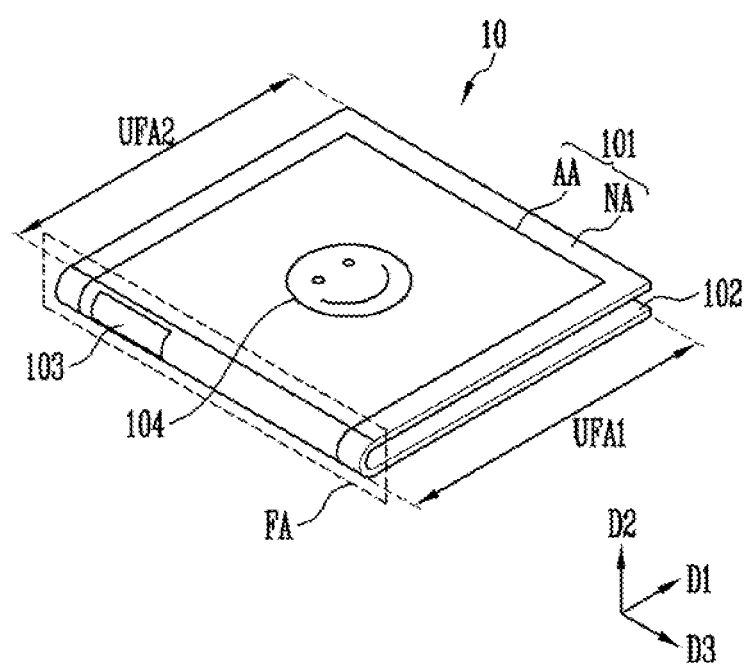
FIG. 16 illustrates display controlled foldable areas and unfoldable areas according to an embodiment of the disclosure.

FIG. 16 illustrates display controlled foldable area FA and unfoldable areas UFA1 and UFA2 according to an embodiment of the disclosure.

Referring to FIGS. 2 and 16, according to an embodiment, when the display device 10 is out-folded, a first unfoldable area UFA1 and a second unfoldable area UFA2 are created in the first surface 101 of the display panel 100. Here, the first unfoldable area UFA1 faces the user, and the second unfoldable area UFA2 is not visible to the user. Hereinafter, for convenience, it is assumed that the first unfoldable area UFA1 is viewed by the user.

According to an embodiment, the second area setting unit 230 compares first orientation signals of the first surface 101 before folding the display panel 100 with second orientation signals of the first surface 101 after folding the display panel 100, and sets the display limitation area based on a comparison result. At this time, the second area setting unit 230 sets one or more unfoldable areas UFA1 or UFA2 where the first orientation signal differs from the second orientation signal as the display limitation area. Here, the orientation signals are generated by the above-described orientation sensor.

For example, according to an embodiment, since the first unfoldable area UFA1 is normal to the second direction D2 and then rotated to face the opposite direction during folding, the orientation signals of the first surface 101 before and after folding in the first unfoldable area UFA1 differ from each other. Therefore the first unfoldable area UFA1 is set as the display limitation area, and thus an image 104 is not displayed in the first unfoldable area UFA1 of the display area AA.

According to an embodiment, on the other hand, the image 104 is displayed in the second unfoldable area UFA2 and the foldable area FA of the display area AA, which are not set as the display limitation area. At this time, when the image 104 is displayed in the foldable area FA, a size of the image 104 varies according to the curvature of the foldable area FA. This is because the area of the display area AA in the foldable area FA varies according to the curvature of the foldable area FA.

For example, according to an embodiment, the control unit 220 calculates the curvature of the foldable area FA based on the force values in the foldable area FA, and controls the display of the image 104 in the display area AA in the foldable area FA based on the curvature. Here, the curvature is calculated as described above with reference to FIGS. 11 and 13.

In addition, according to an embodiment a virtual input button 103 can be displayed in the display area AA in the foldable area FA shown in FIG. 16. Here, the virtual input button 103 performs a specific function installed in the display device 10 and is expressed by an image. For example, the control unit 220 displays the virtual input button 103 in the display area AA of the foldable area FA.

As described above, according to an embodiment, the display device 10 can reduce unnecessary power consumption and prevent malfunction of the display limitation area by setting the display limitation area when the foldable area FA is set.

In addition, according to an embodiment, the display device 10 provides convenience to a user by displaying the virtual input button 103 in the foldable area FA.

Figure 17:
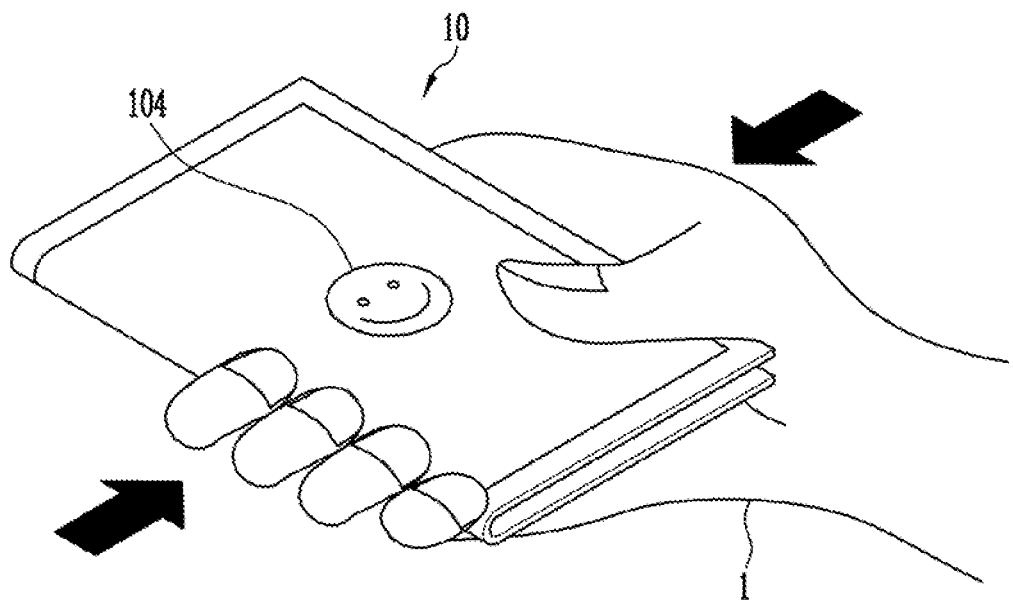
FIG. 17 illustrates an embodiment in which force is applied to a foldable area according to an embodiment of the disclosure.
Figure 18:
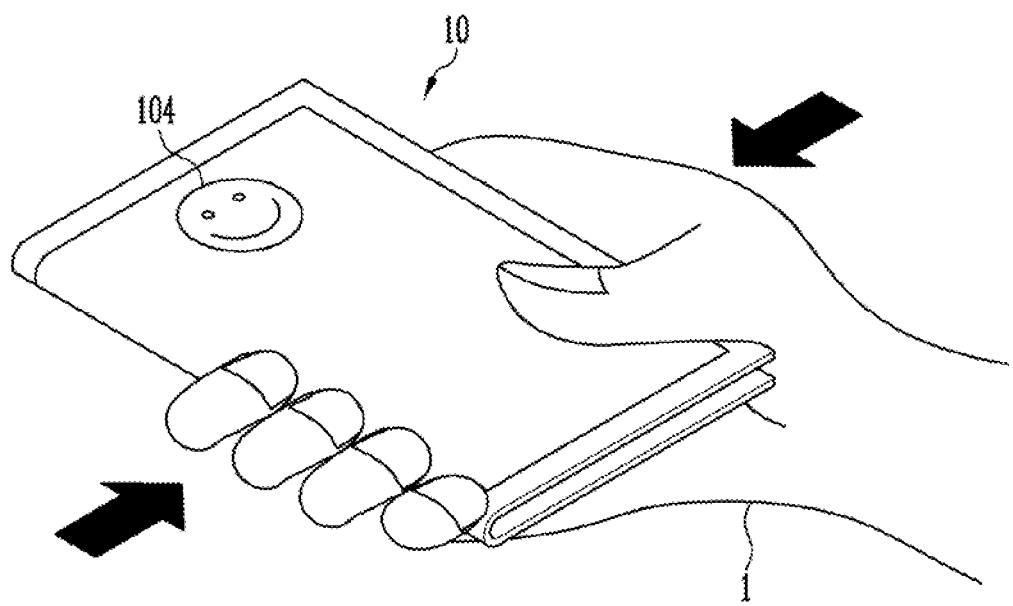
FIG. 18 illustrates an embodiment of display controlled unfoldable areas according to the force applied to the foldable area.

FIG. 17 illustrates an embodiment in which force is applied to the foldable area FA, according to an embodiment of the disclosure, and FIG. 18 illustrates an embodiment of display controlled unfoldable areas UFA1 and UFA2 according to the force applied to the foldable area FA.

Referring to FIGS. 8, 12, 14, and 17, according to an embodiment when the force values in the foldable area FA are equal to or greater than the second reference value and the force values in the foldable area FA are sensed for a preset second reference time or longer, the control unit 220 controls the display is the unfoldable areas UFA1 and UFA2. Here, the second reference time is a period needed to control the display in the unfoldable areas UFA1 and UFA2 based on the force value in the foldable area FA.

Referring to FIGS. 16 to 18, according to an embodiment, when a user 1 squeezes the out-folded display device 10 by applying a force to the foldable area FA, the image 104 displayed in the second unfoldable area UFA2 moves in one direction.

On the other hand, the display device 10 according to an embodiment of the disclosure includes a plurality of folding lines FL1 to FL7 as described above. In this case, the display device 10 can be folded at least twice.

Figure 19:
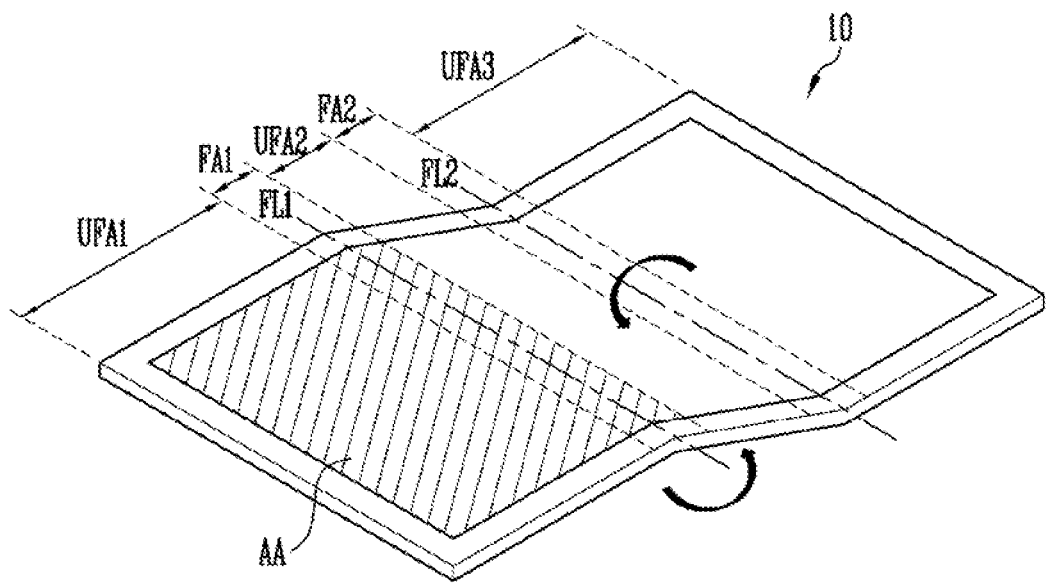
FIG. 19 illustrates an example in which a display device according to an embodiment of the disclosure is folded along two or more folding lines.
Figure 20:
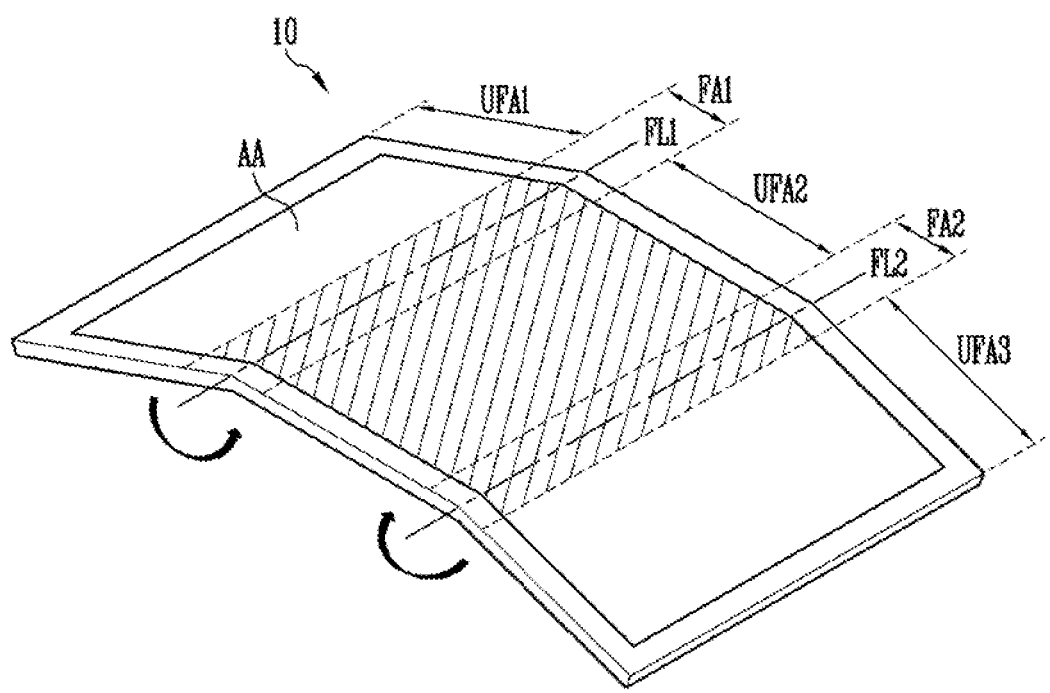
FIG. 20 illustrates another example in which a display device according to an embodiment of the disclosure is folded along two or more folding lines.

FIG. 19 illustrates an example in which the display device 10 according to an embodiment of the disclosure is folded about two or more folding lines FL1 and FL2, and FIG. 20 illustrates another example in which the display device 10 according to an embodiment of the disclosure is folded about two or more folding lines FL1 and FL2.

Referring to FIG. 19, according to an embodiment, the display device 10 is folded about the first folding line FL1 and about the second folding line FL2. Here, folding directions differ from each other. For example, the display device 10 is out-folded about the first folding line FL1 and in-folded about the second folding line FL2. In this case, the display device 10 includes a first foldable area FA1 set based on the first folding line FL and a second foldable area FA2 set based on the second folding line FL2, and includes first to third unfoldable areas UFA1, UFA2, and UFA3.

Here, according to an embodiment, the second area setting unit 230 calculates a folding direction of the first surface 101 based on the force value, and sets at least one foldable area FA in which the folding direction is in-folded and at least one unfoldable area UFA as the display limitation area on the first surface 101. For example, the second foldable area FA2 and the second and third unfoldable areas UFA2 and UFA3 are set as the display limitation areas by being in-folded about the second folding line FL2.

In addition, after the plurality of foldable areas FA1 and FA2 are set, the second area setting unit 230 calculates and sets at least one foldable area FA in which the folding direction is out-folded and the unfoldable area UFA as the display area. For example, the first foldable area FA1 and the first unfoldable area UFA1 are set as the display area by being out-folded about the first folding line FL1, and the image 104 is displayed in the display area AA in the first foldable area FA1 and the first unfoldable area UFA1.

On the other hand, referring to FIG. 20, the folding directions of the display device 10 according to an embodiment of the disclosure may be the same. For example, the display device 10 is out-folded about the first folding line FL1 and out-folded about the second folding line FL2.

Here, according to an embodiment, the first unfoldable area UFA1 and the third unfoldable area UFA3 are set as the display limitation area by being out-folded, and the second unfoldable area UFA2 and the first and second foldable areas FA2 are set as the display area. However, embodiments of the disclosure are not limited thereto.

As described above, the display device 10 according to an embodiment of the disclosure can be folded at least twice to increase portability.

Figure 21:
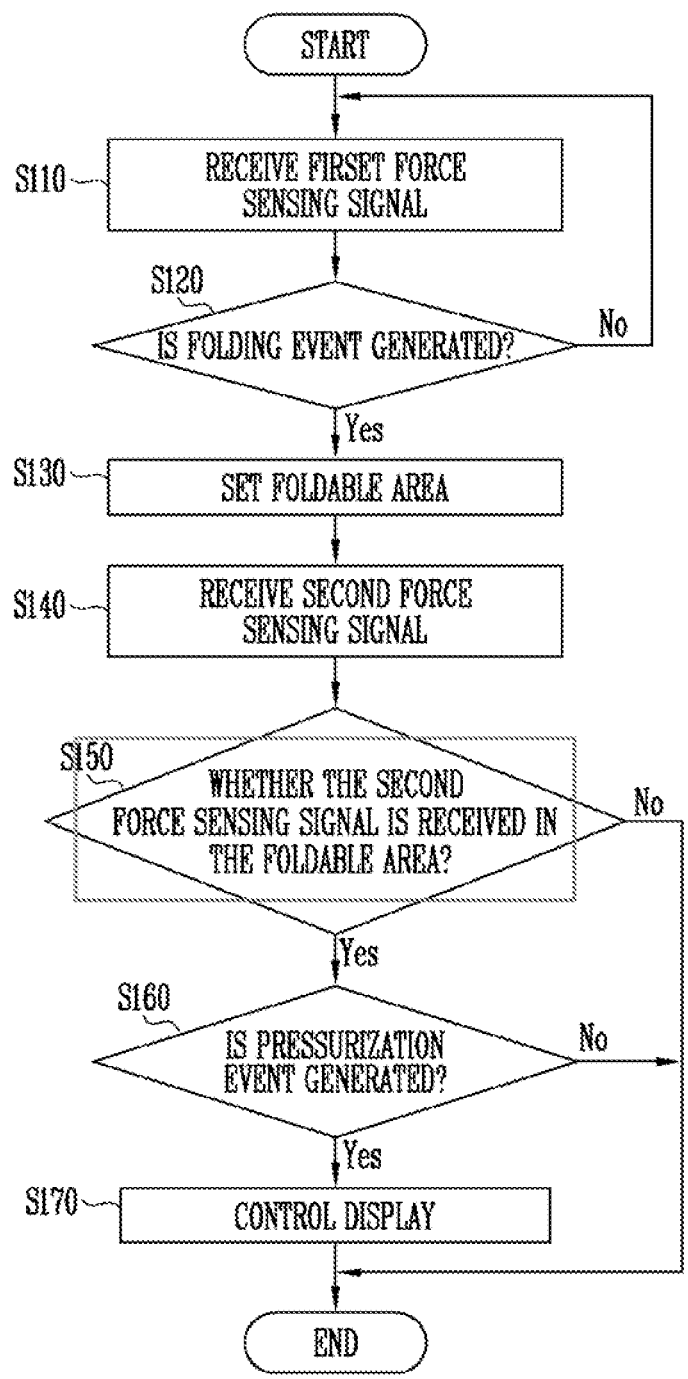
FIG. 21 is a flowchart of an operation of a display device according to an embodiment of the disclosure.

FIG. 21 is a flowchart of an operation of the display device 10 according to an embodiment of the disclosure.

Referring to FIG. 21, according to an embodiment, the display device 10 receives a first force sensing signal (S110) and determines whether a folding event is occurring (S120). For example, the controller 200 receives the first force sensing signals and converts the first force signals into first force values. The controller 200 determines whether a folding event has occurred based on the first force value. Here, the first force sensing signal is received from the force sensor 120 before the display device 10 is folded.

Here, according to an embodiment, whether a folding event is occurring is determined according to the first condition described above, and may be additionally determined by the second condition and the third condition as necessary. For example, in determining whether the display panel 100 is folded, the first area setting unit 210 determines whether each of the first condition, the second condition, and the third condition is satisfied.

According to an embodiment, when a folding event occurs (S120, Yes), the display device 10 sets the foldable area FA (S130), and receives a second force sensing signal (S140). Here, the second force sensing signal is received from the force sensor 120 after the foldable area FA is set.

Next, the display device 10 according to an embodiment of the disclosure determines whether the second force sensing signal is received in the foldable area FA (S150).

When the second force sensing signal received in the foldable area FA (S140, Yes), the display device 10 according to an embodiment of the disclosure determines whether a pressurization event has occurred based on the second force sensing signal (S160).

Here, according to an embodiment, whether a pressurization event has occurred is determined by comparing a force value obtained by converting the above-described second force sensing signal with the second reference value. For example, the control unit 220 determines that a pressurization event has occurred when the force value is equal to or greater than the second reference value.

When a pressurization event has occurred (S160, Yes), the display device 10 according to an embodiment of the disclosure controls the display in at least one of the foldable area FA or the unfoldable area UFA (S170). The image 104 is displayed in the display area of the display controlled area.

Hereinafter, a display device according to another embodiment of the disclosure will be described, but the description will be provided based on a different function from that of the display device 10 according to an embodiment of the disclosure, and a description of the same function as the display device 10 according to an embodiment of the disclosure will be omitted.

Figure 22:
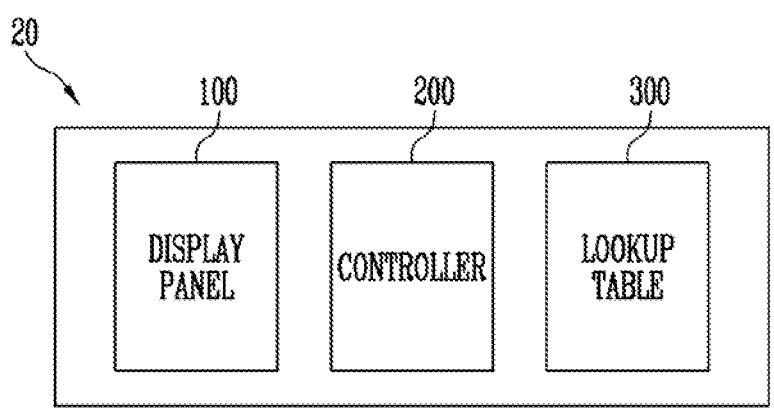
FIG. 22 schematically illustrates a display device according to another embodiment of the disclosure.

FIG. 22 schematically illustrates the display device 20 according to another embodiment of the disclosure.

Referring to FIG. 22, the display device 20 according to another embodiment includes a display panel 100, a controller 200, a lookup table 300, etc.

According to an embodiment, the display panel 100 display the image 104 and outputs the force sensing signals as described above with reference to FIGS. 1 and 16.

According to an embodiment, the controller 200 converts the force sensing signals into force values, set a first condition as when the force values are equal to or greater than the preset first reference value, sets a second condition as when the points where the force values are sensed form the folding line FL, sets a third condition as when the force values are sensed for the preset first reference time or longer, and determines that the display panel 100 is folded about the folding line FL when the first to third conditions are satisfied. Here, a determination order of the first to third conditions can be variously changed according to a design of the controller.

According to an embodiment, the lookup table 300 store display control information that differs for different folding lines FL. Here, the display control information includes specific software such as a music playback program or a video playback program, and includes specific functions, such as playback start, pause, etc., included in the specific software that is being executed.

In addition, according to an embodiment, the controller 200 controls the display of the display panel 100 based on the display control information of the position of the folding line FL.

As described above, embodiments of the disclosure provide the display device that is convenient to use and is portable by displaying the image in the foldable area and the unfoldable area of the display panel even in a folded state.

In addition, embodiments of the disclosure provide a display device that minimizes deviations between a plurality of force sensing signals and prevents malfunction of the display device.

In addition, embodiments of the disclosure provide a display device a small force can perform a desired function in a folded state.

Although embodiments of the disclosure have been described with reference to the accompanying drawings, it will be understood by those skilled in the art to which the disclosure pertains that embodiments may be implemented in other specific forms without changing the technical spirit and essential features of the disclosure. Therefore, it should be understood that embodiments described above are illustrative and are not restrictive in all aspects.

What is claimed is:

1. A display device comprising:
   a display panel that displays an image and outputs force sensing signals in correspondence to an externally applied force; and
   a controller circuit that converts the force sensing signals into force values and controls the display panel in at least one of a foldable area and an unfoldable area of the display panel based on the force values,
   wherein the controller circuit comprises:
   a first area setting unit that determines whether the display panel is folded based on whether the force values are equal to or greater than a first preset reference value as a first condition, and sets die foldable area of the display panel when its is determined that the display panel is folded; and
   a control unit that controls the display panel in the foldable area when the force values in the foldable area are equal to or greater than a second reference value after the foldable area is set.

2. The display device according to claim 1 wherein, in determining whether the display panel is folded, the first area setting unit determines whether points at which the force values are equal to or greater than the first reference value form a folding line as a second condition, and determines whether the force values are sensed for a preset first reference time or longer as a third condition.

3. The display device according to claim 1, wherein the controller circuit generates the force values by amplifying a difference of each of the force sensing signals and a first base signal as a first amplification value, before the foldable area is set, and wherein the controller circuit generates the force values by amplifying a difference between each of the force sensing signals in the foldable area and a second base signal as a second amplification value, after the foldable area is set.

4. The display device according to claim 3, wherein the second base signal is greater than the first base signal.

5. The display device according to claim 4, wherein the second amplification value is greater than the first amplification value.

6. The display device according to claim 5, wherein the control unit calculates a curvature of the foldable area based on the force values in the foldable area, and determines the second base signal based on the curvature.

7. The display device according to claim 6, wherein the second base signal is increased in magnitude as the curvature of the foldable area increases.

8. The display device according to claim 5, wherein the second reference value is equal to or less than the first reference value.

9. The display device according to claim 3, wherein the display panel comprises a force sensor that senses the externally applied force and outputs at least one force sensing signal, and the controller circuit further comprises:
a first amplifier that amplifies the received force sensing signal; and
an analog-digital converter that receives the amplified force sensing signal and outputs at least one force value.

10. The display device according to claim 9, wherein a first terminal of the first amplifier receives the at least one force sensing signal,
a second terminal of the first amplifier receives the first base signal, and
a gain of the first amplifier is the first amplification value.

11. The display device according to claim 10, wherein the controller circuit further comprises:
a second amplifier that amplifies the received at least one force sensing signal; and
a switching module that connects the force sensor to one of the first amplifier or the second amplifier,
a first terminal of the second amplifier receives the at least one force sensing signal,
a second terminal of the second amplifier receives the second base signal, and
a gain of the second amplifier is the second amplification value.

12. The display device according to claim 11, wherein the control unit transmits a first connection instruction signal that connects the force sensor and the first terminal of the first amplifier to the switching module, before the foldable area is set, and the control unit transmits a second connection instruction signal that connects the force sensor and the first terminal of the second amplifier to the switching module, after the foldable area is set.

13. A display device comprising:
a display panel that displays an image and outputs force sensing signals correspondence to an externally applied force; and
a controller circuit that converts the force sensing signals into force values and controls the display panel in at least one of a foldable area and an unfoldable area of the display panel based on the force values, wherein the controller circuit comprises:
a first area setting unit that determines whether the display panel is folded based on whether the force values are equal to or greater than a first preset reference value as a first condition, and sets the foldable area of the display panel when it is determined that the display panel is folded; and
a control unit that calculates a curvature of the foldable area based on the force values in the foldable area, and controls the display of the image in a display area in the foldable area based on the curvature.

14. The display device according to claim 13, wherein the control unit controls the display in the foldable area when the force values in the foldable area are equal to or greater than a second reference value after the foldable area is set and displays a virtual input button in the display area of the foldable area.

15. The display device according to claim 13, further comprising:
a second area setting unit that receives orientation signals that indicates an orientation of a first surface of the display panel, and sets a display limitation area on the first surface based on the orientation signals, and
the control unit limits the display of the image in the display limitation area.

16. The display device according to claim 15, wherein the second area setting unit compares first orientation signals of the first surface before folding the display panel with second orientation signals of the first surface after folding the display panel, and sets the display limitation area based on a comparison result.

17. The display device according to claim 16, wherein the second area setting unit sets at least one unfoldable area where the first orientation signal differs from the second orientation signal as the display limitation area.

18. The display device according to claim 17, wherein the second area setting unit calculates a folding direction of the first surface based on the force values, and sets at least one foldable area and at least one unfoldable area where the folding direction is in-folded on the first surface as the display limitation area.

19. The display device according to claim 13, wherein the control unit controls display in the unfoldable area when the force values in the foldable area are equal to or greater than a second reference value and the force values in the foldable area are sensed for a preset second reference time or longer.

20. A display device comprising:
a display panel that displays an image and outputs force sensing signals in correspondence to an externally applied force;
a controller that
converts the force sensing signals into force values,
determines whether the force values are equal to or greater than a first preset reference value as a first condition,
determines whether points where the force values are sensed form a folding line as a second condition,
determines whether the force values are sensed for a preset first reference time or longer as a third condition, and
determines that the display panel is folded about the folding line when the first to third conditions are satisfied; and
a lookup table that stores display control information for folding lines of different positions, wherein the controller controls the display panel based on display control information that corresponds to a position of the folding line.

\* \* \* \* \*